United States Patent
Lancaster et al.

(10) Patent No.: US 6,628,114 B2
(45) Date of Patent: *Sep. 30, 2003

(54) HIGH LINEARITY, LOW OFFSET INTERFACE FOR HALL EFFECT DEVICES

(75) Inventors: Andrew Lancaster, Seneca, SC (US); Farah Kobbi, Seneca, SC (US); Michel Gervais, Champigny sur Marne (FR); Wendell Goodwin, Dunwoody, GA (US); Karl Heinz-Buethe, Aerzen (DE)

(73) Assignee: Schlumberger Resource Management Services, Inc., Norcross, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/236,788

(22) Filed: Sep. 6, 2002

(65) Prior Publication Data

US 2003/0006753 A1 Jan. 9, 2003

Related U.S. Application Data

(63) Continuation of application No. 09/952,710, filed on Sep. 14, 2001, now Pat. No. 6,525,524, which is a continuation of application No. 09/413,616, filed on Oct. 6, 1999, now Pat. No. 6,392,400.
(60) Provisional application No. 60/103,525, filed on Oct. 8, 1998.

(51) Int. Cl.$^7$ .................. G01R 33/00; G01R 29/22; G01R 11/32; H01L 35/00; H01L 43/00
(52) U.S. Cl. .................. 324/117 R; 324/117 H; 324/142; 324/109; 327/513; 327/560; 338/32 H
(58) Field of Search .............. 324/117 H, 142, 324/117 R, 109; 338/32 H; 327/513, 560

(56) References Cited

U.S. PATENT DOCUMENTS

| | | |
|---|---|---|
| 3,657,686 A | 4/1972 | Masuda et al. |
| 3,668,670 A | 6/1972 | Andersen |
| 3,800,193 A | 3/1974 | Ashar et al. |
| 3,882,409 A | 5/1975 | Yagi |
| 4,188,605 A | 2/1980 | Stout |

(List continued on next page.)

OTHER PUBLICATIONS

U.S. patent application No. 09/952,710, filed Sep. 14, 2002, entitled: High Linearity, Low Offset Interface For Hall Effect Devices. (US 6,525,524 B2).

*Primary Examiner*—Andrew H. Hirshfeld
*Assistant Examiner*—Wasseem H. Hamdan
(74) *Attorney, Agent, or Firm*—Dority & Manning, P.A.; Leonard W. Pojunas, Jr., Esq.

(57) ABSTRACT

A Hall effect sensor or device may be used in a variety of embodiments, such as measuring current within an associated conductor by helping to measure flux density within a gap of a ferromagnetic power meter core, such as in a power meter. A high linearity interface for a Hall effect device is provided for minimizing offset effects without using complicated electronic circuits. Hall effect device is characterized by first and second opposing surfaces, first and second device inputs, and first and second device outputs. A substrate is layered adjacent to one of the first and second opposing surfaces of the Hall effect device and is electrically connected to an output pin of the Hall effect device to eliminate any effects caused by asymmetry of the voltage appearing in the channel relative to the substrate. The net effect of the high linearity interface is to eliminate any adverse effects to linearity of the system, especially at low magnetic flux levels where the output voltage of the Hall device would be relatively small compared to the offset voltage levels involved. The interface virtually eliminates adverse effects from operational amplifier input offset voltages, Hall effect device output offset voltages, and any common mode voltages.

11 Claims, 2 Drawing Sheets

U.S. PATENT DOCUMENTS

| | | | |
|---|---|---|---|
| 4,218,659 A | * | 8/1980 | Arai ............................... 330/6 |
| 4,262,275 A | * | 4/1981 | DeMarco et al. ......... 338/32 H |
| 4,293,814 A | * | 10/1981 | Boyer ........................ 324/166 |
| 4,528,502 A | * | 7/1985 | Rocha .................... 324/117 R |
| 4,550,597 A | | 11/1985 | Drutchas et al. |
| 4,780,625 A | * | 10/1988 | Zobel ......................... 307/350 |
| 4,804,957 A | | 2/1989 | Selph et al. |
| 4,823,075 A | | 4/1989 | Alley |
| 4,937,521 A | | 6/1990 | Yoshino et al. |
| 5,093,617 A | | 3/1992 | Murata |
| 5,180,970 A | | 1/1993 | Ross |
| 5,438,257 A | | 8/1995 | Berkcan |
| 5,473,250 A | | 12/1995 | Dillman |
| 5,694,103 A | * | 12/1997 | Goodwin et al. ............ 336/178 |
| 6,104,231 A | * | 8/2000 | Kirkpatrick, II ............ 327/513 |
| 6,232,832 B1 | * | 5/2001 | Kirkpatrick, II ............ 327/560 |

* cited by examiner

HIGH LINEARITY, LOW OFFSET INTERFACE FOR HALL EFFECT DEVICES

PRIORITY CLAIM

This application is based on Provisional Application U.S. Ser. No. 60/103,525 filed on Oct. 8, 1998, and is a continuation of Non-Provisional Application U.S. Ser. No. 09/952,710 filed Sep. 14, 2001 now issued as U.S. Pat. No. 6,525,524 B2, which is a continuation of Non-Provisional Application U.S. Ser. No. 09/413,616 filed Oct. 6, 1999 (now issued as U.S. Pat. No. 6,392,400.)

BACKGROUND OF THE INVENTION

The present invention concerns improved Hall effect devices generally and more particularly relates to improved linearity of interfaces for Hall effect devices. Such Hall effect devices are particularly useful for incorporation into power meters, for placement in ferromagnetic core gaps for metering electrical power being drawn from a power grid.

One use of Hall effect sensors is in power meters designed to measure electrical power consumption. One example of such a power meter arrangement with inclusion and use of a Hall effect sensor is disclosed in commonly owned U.S. Pat. No. 5,694,103, issued to Goodwin, et al.

Goodwin, et al. discloses a ferromagnetic core arrangement having a central core leg defining a core gap in which a Hall effect sensor is located. The sensor produces a measurable Hall voltage that is proportional to the magnetic flux density within the gap and to the bias current supplied to the sensor. If the bias current is made proportional to the instantaneous line voltage, the Hall output becomes a measure of power. Hence, the power meter may be used for measuring power consumption from an associated power grid.

In general, additional or complicated stages in any sensing or metering system can create the possibility of reduced signal quality and/or higher costs. Also, certain components inherently have the potential to interject certain noise signals into an overall system. For example, operational amplifiers may have input offset voltages and Hall effect devices may have output offset voltages which could otherwise affect the linearity of any system in which they are used.

One particular potential problem can occur at relatively low magnetic flux levels. In such instances, the output voltage of the Hall device would ordinarily be relatively small as compared to potential offset voltage levels. Hence, under such conditions, particular problems may exist with obtaining quality metering, especially concerning the linearity of the collective system Still another potential source of noise signals is the occurrence of common mode voltages. These typically must otherwise be rejected by following system electronics, or otherwise they will appear at the system level as noise.

Yet another potential difficulty causing system degradation arises from temperature effects and component values. It is especially difficult to address certain such problems in the context of reducing costs, since relatively lower cost components may sometimes have wider specification tolerances and lesser desired responses to temperature effects. In other words, attempts to use lower cost components may in some instances exacerbate existing system problems.

The entire disclosure of the above-referenced issued U.S. Pat. No. 5,694,103 is fully incorporated herein by reference.

SUMMARY OF THE INVENTION

The presently disclosed technology recognizes and addresses various of the foregoing problems, and others, concerning Hall effect devices. Thus, broadly speaking, a principal object of this technology is improved Hall effect device operations. More particularly, a main concern is improved interfaces with Hall effect devices.

It is therefore another particular object of the present subject matter to provide interfaces having improved, high linearity for Hall effect devices. In such context, it is an overall objective to reduce and minimize offset effects without the use of complicated electronic circuits.

Similarly, another present object is to virtually eliminate common mode voltages that must otherwise be rejected by more expensive system electronics, or otherwise appear at a system level as noise.

Still a further more particular object of the present subject matter is to provide an improved interface system that provides exceptional performance at very low cost. At the same time, it is an object to provide such an improved system that is very robust to temperature effects and component values.

Additional objects and advantages of the disclosed technology are set forth in, or will be apparent to those of ordinary skill in the art from, the detailed description herein. Also, it should be further appreciated that modifications and variations to the specifically illustrated and discussed features hereof may be practiced in various embodiments and uses of this technology without departing from the spirit and scope thereof, by virtue of present reference thereto. Such variations may include, but are not limited to, substitution of equivalent means and features for those shown or discussed, and the functional or positional reversal of various parts, features, or the like.

Still further, it is to be understood that different embodiments, as well as different presently preferred embodiments, of this subject matter may include various combinations or configurations of presently disclosed features or their equivalents (including combinations of features or configurations thereof not expressly shown in the figures or stated in the detailed description).

One exemplary embodiment of the present subject matter relates to a Hall effect sensor with an improved output interface, wherein the Hall effect sensor and associated interface is characterized by high linearity and low offset performance. Such a Hall effect sensor preferably includes a Hall effect device characterized by first and second opposing surfaces and formed with first and second device inputs and first and second device outputs, a substrate layered adjacent to a selected one of the first and second opposing surfaces of the Hall effect device, an electrical connection between the substrate and one the first and second device outputs, and a biasing current. A capacitively coupled relationship is formed between the substrate and the upper layers of the Hall effect device at the surface opposing the substrate. Such capacitively coupled relationship preferably aids in reducing any charge trapping that occurs during operation of the Hall effect sensor. The device output to which the substrate is electrically connected is provided at a ground potential and the electrical connection forms in part a biasing circuit for eliminating undesirable offset effects due to non-symmetries in the Hall effect device and for eliminating common mode voltages. The biasing current is supplied to the Hall effect device at a level proportional to the line voltage with which the device and interface are associated.

Yet another exemplary embodiment of the disclosed technology relates to a power meter arrangement including a laminated ferromagnetic power meter core and a Hall effect sensor. The laminated ferromagnetic power meter core has a designated region thereof defining a core gap, and the Hall effect sensor resides in the core gap and is capable of sensing magnetic flux concerning current flow through an associated conductor line. The sensed levels of magnetic flux can then be utilized to derive power consumption data for the power meter arrangement. The Hall effect sensor residing in the core gap may correspond to such exemplary embodiment as described above.

Additional embodiments may comprise various combinations of the above referenced exemplary features (or their equivalents), and/or other features.

It is to be understood that the present subject matter likewise encompasses the use of methodologies and techniques which correspond with practice of the physical apparatuses and devices otherwise disclosed herein.

Those of ordinary skill in the art will better appreciate the features and aspects of such embodiments, methods, techniques, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
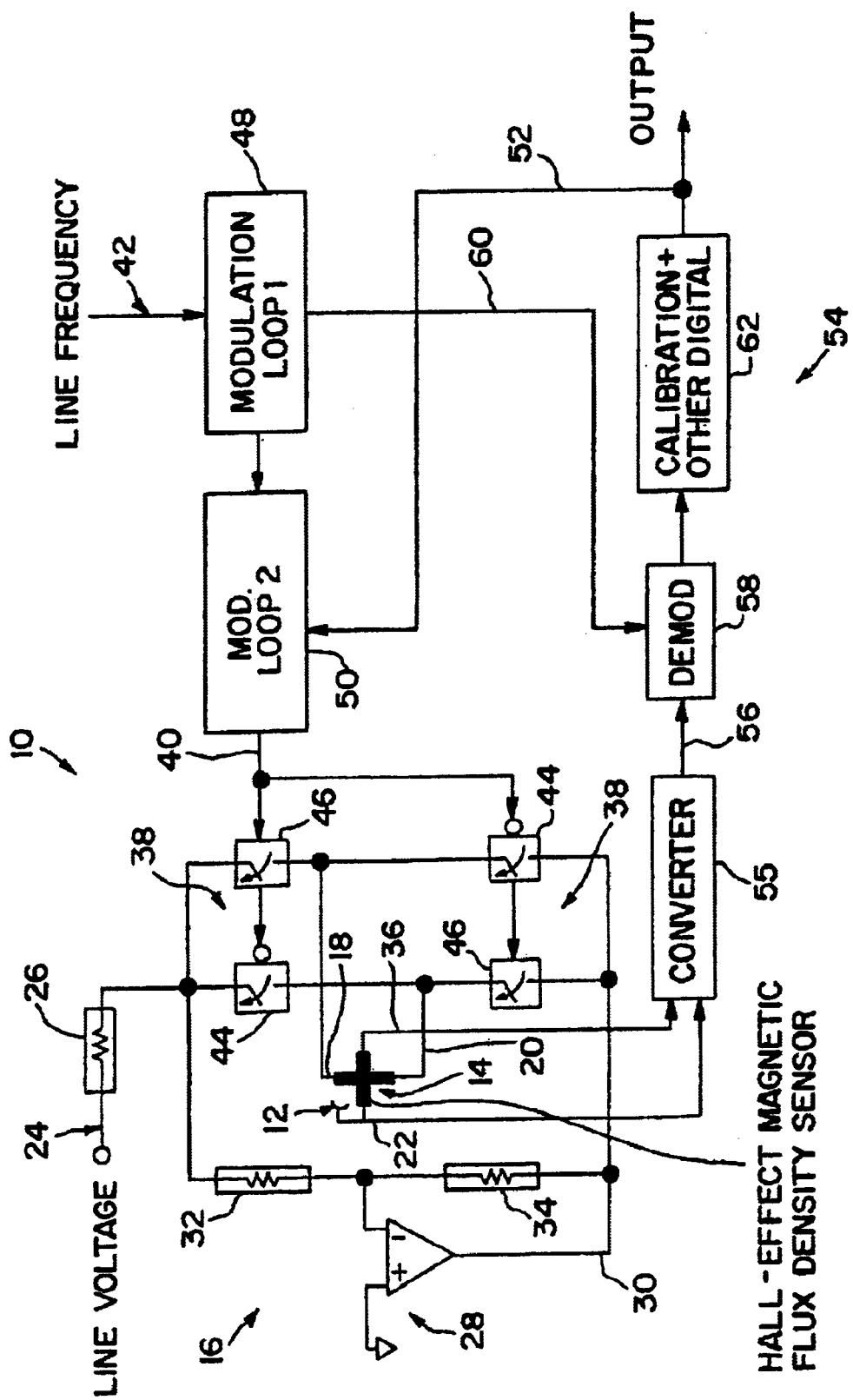
FIG. 1 is a largely diagrammatical or schematic view of an exemplary embodiment in accordance with the present invention.

Repeat use of reference characters throughout the present specification and appended drawings is intended to represent same or analogous features, elements, or steps of the invention.

DETAILED DESCRIPTION OF THE PREFERRED EMBODIMENTS

FIG. 1 illustrates a generally diagrammatical or schematic view of an improved Hall effect device interface generally 10 in accordance with the subject invention. Those of ordinary skill in the art will appreciate that various embodiments of the subject invention may be practiced. In addition, a Hall effect device with an improved interface as in accordance with the subject invention may be practiced in different embodiments and settings other than the power meter embodiment disclosed in U.S. Pat. No. 5,694,103, incorporated herein by reference. All such variations and modifications and alternate uses are intended to come within the spirit and scope of the subject invention.

Improved interface 10 is an electronic interface that addresses the problem of simultaneously providing a relatively low cost interface with high linearity, for use with a Hall effect device. The exemplary embodiment 10 meets the overall objective in reducing and minimizing offset effects without the use of complicated electronic circuits. Such offsets may include operational amplifier input offset voltages and Hall effect device output offset voltages which would otherwise affect the linearity of this system. Such adverse affects especially occur at low magnetic flux levels where the voltage output of the Hall device is quite small compared to the offset voltage levels.

As illustrated, the overall interface system 10 uses an operational amplifier and multiple modulation loops in order to achieve an overall system with exceptional performance. At the same time, it may be provided in a relatively low cost embodiment, even while being very robust to temperature effects and component values.

One aspect of the subject invention involves use of a biasing technique for an associated Hall effect device. Such technique is incorporated in conjunction with the connection of the substrate 12 of the Hall effect device generally 14. Such biasing technique almost totally eliminates undesirable offset effects due to non-symmetries in device 14, which especially becomes significant at low magnetic flux levels. Examples of sources or types of such non-symmetries are referenced above.

The exemplary embodiment of the subject invention uses a differential drive circuit generally 16 to invert an input voltage present at a first input 18 of Hall effect sensor 14, and to apply such inverted voltage to a second input generally 20 of sensor 14. Such an arrangement generates a fully symmetrical electrical gradient in the Hall effect channel with a virtual ground at the midpoint, which is very close to the potential of the output nodes of the Hall cell. A virtual ground involves use of a "neutral" or center point halfway between a positive and negative source, resulting in a "neutral" value even though not directly associated with a traditional ground connection.

In addition to the foregoing benefits, the effects due to the potential difference on the substrate 12 relative to the Hall cell channel (within Hall effect device 14) are eliminated by connecting such substrate 12 to one of the output pins generally 22 of device 14. Such output pin 22 is held at an almost virtual ground.

An additional benefit of the exemplary interface 10 is the elimination of the large common mode voltages normally present at the output of the Hall effect device generally 14. Otherwise, such large common mode voltages must be rejected by electronics within the system, in order to prevent them from appearing as system noise.

In the exemplary embodiment of interface 10, the Hall effect device generally 14 is supplied with a bias current proportional to the line voltage generally appearing on line 24. A relatively high biasing resistor value generally 26 is provided so as to utilize line voltage 24 as a current source for the Hall effect device. Such current source could, as a substitute, be equally well derived from another source for different modes of operation.

In general, and as well known to one of ordinary skill in the art, the Hall effect is an effect observed when a current-carrying conductor is placed in a magnetic field whose direction is perpendicular to both the direction of current and of the magnetic field. A Hall effect device is one that utilizes such Hall effect in order to measure the charge carrier concentration in a metal or semiconductor or to detect magnetic fields. For example, measurement of the Hall voltage such as produced in a flat plate or wafer (sometimes referred to as a Hall probe) of known dimensions can be used to detect the presence of a magnetic flux density if the Hall coefficient of the material is known. As understood by one of ordinary skill in the art from the disclosure set forth in U.S. Pat. No. 5,694,103 (incorporated herein by reference), such information may be ultimately processed for determining more specifically useful information, such as the power consumption through a power meter.

As further illustrated by the exemplary embodiment of interface 10, the voltage appearing at the first input 18 of Hall effect device 14 may be sensed and inverted by an operational amplifier (Op-Amp) generally 28. Such inverted voltage as appearing on line 30 may then be applied to the opposite or second input generally 20 of Hall effect device 14.

Since the interface of the subject invention is being driven from a current source, such interface only relies on the inversion of the Op-Amp 28 in order to provide a differential voltage across the respective inputs 18 and 20 of Hall effect device 14. The system gain is independent of such voltage and therefore the performance of interface 10 is not affected by the magnitude of such voltage.

As illustrated in greater detail in present FIG. 1, Op-Amp 28 is provided with further biasing resistors 32 and 34, respectively, for being properly prepared for operation in interface 10, as understood by one of ordinary skill in the art without additional discussion required.

As represented, interface 10 generates what may be regarded as a true differential voltage across Hall effect device 14. Accordingly, the respective output pins 22 and 36 of Hall effect device 14 are held at a virtual ground potential. Such an arrangement virtually eliminates any common mode voltages that otherwise must be rejected by the system electronics or appear at the system level as noise.

Substrate 12 of the Hall effect device generally 14 is preferably connected electrically to either an output pin generally 22 of Hall device 14 or to a separate virtual ground. As referenced above, a virtual ground is a center or "neutral" point existing halfway between positive and negative signal points. Use of either a virtual ground or coupling to an output pin eliminates any effects caused by asymmetry of the voltage in the channel relative to the substrate.

In general, substrate 12 is capacitively coupled to the upper layers of the component forming Hall effect device generally 14. It has been observed that charge can sometimes flow down from the upper layers of Hall effect device 14 when it is not supposed to be flowing away from such surface or upper levels. Some charges may become misdirected and gather in pockets in what is referred to as charge trapping. By providing substrate 12 with a bias, such charges are driven back out towards the surface as desired, thereby improving the function of interface 10.

Switch means generally 38 are driven by a modulation signal generally 40 that is generally synchronized to the line frequency generally 42. Such switching means 38 may comprise, for example, FET switches which have been paired to eliminate any charge injection problems. As represented, the paired switches each include an inverting switch component generally 44 and a non-inverting switch component generally 46, shown in-line relative to its associated inverted pair. The modulation synchronized to line frequency 42 cancels a large portion of the offsets from the Hall effect device and from any subsequent electronics. Such modulation is represented by a referenced modulation loop 1 means generally 48, which may comprise modulating switches reactive to the line frequency generally 42.

A second level of modulation loop means generally 50 may be provided in-line with modulation signal 40 for fine tuning same. Specifically, the second modulation loop means 50 may comprise modulation which is generated from and synchronized with the calibrated output generally 52 of the output stage of the device, which may comprise an output converter chip generally 54. Such second level of modulation generally 50 further enhances offset rejection of the overall system. The components of record modulation means 50 may be of the same type as those of first modulation means 48, simply reacting to a different modulation input.

As further represented by the exemplary embodiment of present FIG. 1, the respective analog output signals 22 and 36 of Hall effect device generally 14 are converted by converter means generally 55 into a single analog signal generally 56, representing the difference between the two signals 22 and 36. Thereafter, the demodulation means generally 58 may be operated, based on a further output generally 60 from the first modulation means generally 48. Such demodulation stage results, in essence, in removing any modulation aspects initially interjected based on the line frequency signal generally 42.

The second modulation loop means generally 50 basically eliminates anything else that has not "changed" throughout the process, which would primarily be offset values which are desired to be eliminated. In other words, the second modulation loop generally 50 results in correction for any "error" which has otherwise infiltrated the interface system generally 10.

Calibration means generally 62 provides for further processing, including such as digitizing a signal into a desired format, for example a sawtooth signal. It is to be understood that all of such means 55, 58, and 62 may be collectively incorporated into a device constituting a converter chip generally 54 or otherwise.

The combination of using two modulation loop means generally 48 and 50 results in the second loop (which is asynchronous) constituting a second level of modulation which rejects any remaining offset (i.e., error) values. The control of the substrate voltage, for example, to a point that is virtual ground may also be regarded as highly beneficial, even though it may be achieved with a relatively simple electrical connection. Such arrangement helps to ensure high level performance of the interface generally 10.

Figure 2:
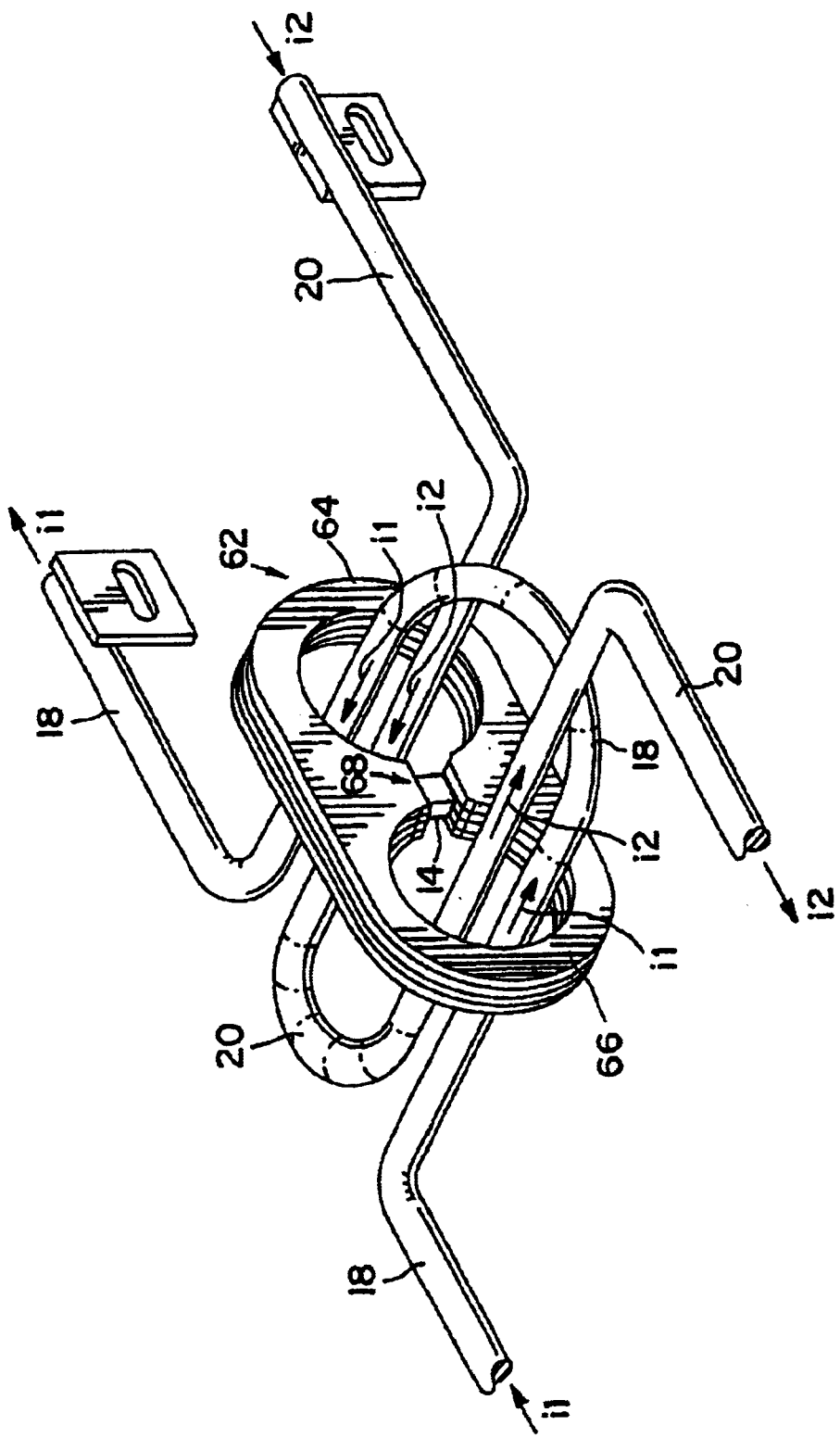
FIG. 2 is a perspective view of an exemplary ferromagnetic power meter core configuration.

FIG. 2 is a perspective view of a ferromagnetic core arrangement for power meters that embodies principles of the present invention in a preferred form. The arrangement of FIG. 2 includes the placement and orientation of the current carrying conductors. The apparatus of FIG. 2 comprises a ferromagnetic core 62 that is formed generally in the shape of a "figure 8" having a right lobe and a left lobe defining right and left openings respectively. The core 62 preferably is formed of a ferromagnetic material of high magnetic permeability so as to provide a low resistance to magnetic flux traversing the core material. An example of ferromagnetic materials with high permeability is the various NiFe alloys with greater than 50% Ni. Other suitable materials can also be used and such materials are known to those of skill in this art. These materials exhibit high magnetic permeabilities and thus low reluctance to magnetic flux. The core 62 is formed with a right leg 64, a left leg 66, and a center leg 68. The center leg 68 is severed to define an air gap within which a Hall-effect magnetic flux density sensor 14 can be positioned.

The configuration of FIG. 2 is intended for use in measuring electric power usage in U.S. two phase power distribution grids. In such a system, it is desired to measure the sum of i1 and i2 in order to determine the total power usage by a service customer. The configuration of FIG. 2 accomplishes this goal. The conductor 18, which conducts the current i1, is configured to loop through the left opening of the core 62 and then back through the right opening of the core. Similarly, the conductor 20 loops in the opposite direction through the left opening of the core and then back through the right opening of the core. In this way, currents i1 and i2 traverse each core opening in the same direction to produce a magnetic flux within the core that is proportional to the sum of currents i1 and i2. Furthermore, it is seen in FIG. 2 that the conductors 18 and 20 traverse the core 62 in an over-under relationship within respect to each other. That is to say, in the opening formed in the right-hand lobe of the core 62, the conductor 18 is positioned above the conductor 20. Conversely, in the opening formed in the left hand lobe of the core, conductor 20 overlies conductor 18. This configuration has been found to produce a magnetic flux within the core that is more homogenous and less dependent upon the positioning or placement of the conductors within their respective openings.

The foregoing presently preferred embodiments are exemplary only, and the attendant description thereof is likewise by way of words of example rather than words of limitation, and their use does not preclude inclusion of such modifications, variations, and/or additions to the present invention as would be readily apparent to one of ordinary skill in the art, the scope of the present invention being set forth in the remainder of the specification.

What is claimed is:

1. A Hall effect sensor with improved output interface for high linearity and low offset performance, as associated with a given line voltage, comprising:
   a Hall effect device characterized by first and second opposing surfaces and formed with first and second device inputs and first and second device outputs;
   a substrate layered adjacent to a selected one of said first and second opposing surfaces of said Hall effect device to form a capacitively coupled relationship between said substrate and the Hall effect device layers at the surface opposing said substrate, to reduce the potential for charge trapping during operation of said Hall effect sensor;
   an electrical connection between said substrate and one of said first and second device outputs, said electrical connection forming in part a biasing circuit for eliminating undesirable offset effects due to non-symmetries in the Hall effect device and for eliminating common mode voltages, wherein the device output to which said substrate is connected is provided at a virtual ground potential; and
   a biasing current supplied to said Hall effect device proportional to the line voltage with which said device and interface are associated.

2. A Hall effect sensor with improved output interface as in claim 1, further including a differential drive circuit for inverting an input voltage appearing at one of said Hall effect device inputs and applying such inverted signal to the other of said Hall effect device inputs.

3. A Hall effect sensor with improved output interface as in claim 1, further including:
   plural pairs of inverting and non-inverting switch components connected between a given line voltage and said Hall effect device inputs, having controlled respective switching inputs commonly controlled by a modulation signal; and
   modulation means operative with the associated line frequency for generating said modulation signal with reference to line frequency.

4. A Hall effect sensor with improved output interface as in claim 1, wherein said biasing circuit further includes a differential drive circuit for inverting an input voltage appearing at one of the Hall effect device inputs and applying such inverted signal to the other of the Hall effect inputs.

5. A Hall effect sensor with improved output interface as in claim 1, wherein said biasing circuit further includes an in-line biasing resistor for supplying to said Hall effect device said biasing current.

6. A power meter arrangement, comprising:
   a laminated ferromagnetic power meter core having a designated region thereof defining a core gap; and
   a Hall effect sensor residing in said core gap of said power meter core for sensing magnetic flux from which power consumption data may be derived concerning current flow through an associated conductor line, said Hall effect sensor including:
      a Hall effect device characterized by first and second opposing surfaces and formed with first and second device inputs and first and second device outputs;
      a substrate layered adjacent to a selected one of said first and second opposing surfaces of said Hall effect device to form a capacitively coupled relationship between said substrate and the Hall effect device layers at the surface opposing said substrate, to reduce the potential for charge trapping during operation of said Hall effect sensor;
      an electrical connection between said substrate and one of said first and second device outputs, said electrical connection forming in part a biasing circuit for eliminating undesirable offset effects due to non-symmetries in the Hall effect device and for eliminating common mode voltages, wherein the device output to which said substrate is connected is provided at a virtual ground potential; and
      a biasing current supplied to said Hall effect device proportional to the line voltage with which said device and interface are associated.

7. A power meter arrangement as in claim 6, wherein said Hall effect sensor further includes:
   switch means, responsive to switching control input thereto, for selectively switching line voltage, a parameter of which is to be sensed, to the inputs of the Hall effect device;
   modulation means for controlling the switching characteristics of said switch means by providing said switching control input thereto; and
   output converter chip means for receiving the outputs of the Hall effect device and providing a selectively processed digitized output therefrom.

8. A power meter arrangement as in claim 6, further including a differential drive circuit for inverting an input voltage appearing at one of the Hall effect device inputs of said Hall effect sensor and applying such inverted signal to the other of said Hall effect device inputs.

9. A power meter arrangement as in claim 6, further including:
   plural pairs of inverting and non-inverting switch components connected between a given line voltage and said Hall effect device inputs, having controlled respective switching inputs commonly controlled by a modulation signal; and
   a modulator operative with the associated line frequency for generating said modulation signal with reference to line frequency.

10. A power meter arrangement as in claim 6, wherein said biasing circuit further includes a differential drive circuit for inverting an input voltage appearing at one of the Hall effect device inputs and applying such inverted signal to the other of the Hall effect inputs.

11. A power meter arrangement as in claim 6, wherein said biasing circuit further includes an in-line biasing resistor for supplying to said Hall effect device said biasing current.

* * * * *